(12) United States Patent
Byrne et al.

(10) Patent No.: US 6,859,351 B2
(45) Date of Patent: Feb. 22, 2005

(54) ELECTROSTATIC DISCHARGE PROTECTION

(75) Inventors: Daniel J. Byrne, Fort Collins, CO (US); Amol S. Pandit, Greeley, CO (US); Mark Nelson Robins, Greeley, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 152 days.

(21) Appl. No.: 10/215,501

(22) Filed: Aug. 9, 2002

(65) Prior Publication Data

US 2004/0027779 A1 Feb. 12, 2004

(51) Int. Cl.[7] .............................................. H01H 47/00
(52) U.S. Cl. ....................................................... 361/220
(58) Field of Search ........................ 361/220, 56, 212, 361/129, 91.1, 128, 130; 250/324

(56) References Cited

U.S. PATENT DOCUMENTS

| | | | |
|---|---|---|---|
| 5,635,968 A | 6/1997 | Bhaskar et al. | |
| 5,656,530 A | 8/1997 | Leary | |
| 5,969,924 A | 10/1999 | Noble | |
| 5,995,353 A | 11/1999 | Cunningham et al. | |
| 6,002,569 A | 12/1999 | Horvath | |
| 6,241,537 B1 * | 6/2001 | Tate et al. | 439/108 |
| 6,370,029 B1 | 4/2002 | Kawan | |
| 6,510,034 B2 * | 1/2003 | Palinkas et al. | 361/119 |

* cited by examiner

*Primary Examiner*—Brian Sircus
*Assistant Examiner*—James A Demakis

(57) ABSTRACT

Electrostatic discharge (ESD) elements facilitate protection of electronic components from ESD events. The ESD element includes a pair of spark gaps between a first side and second side of the ESD element. The first side of the ESD element includes a peaked portion and a substantially planar portion. The second side of the ESD element includes a peaked portion opposite the substantially planar portion of the first side and a substantially planar portion opposite the peaked portion of the first side. This asymmetry facilitates use of peaked emitters regardless of the polarity of the charge applied to the ESD element while further facilitating the use of more optimized receiver surfaces opposite the emitters.

30 Claims, 3 Drawing Sheets

ELECTROSTATIC DISCHARGE PROTECTION

FIELD OF THE INVENTION

The present invention relates generally to electrostatic discharge (ESD) protection of electronic devices.

BACKGROUND

Electronic devices, e.g., digital cameras, docking stations, printers, computers, handheld appliances, scanners, etc., are susceptible to electronic component disruption by the introduction of ESD events, commonly referred to as static electricity discharges. ESD events are generally in the range of several or even tens of thousands of volts per discharge. While each discharge is extremely short in duration, such potential differentials can cause disruptions to electronic devices such as loss of memory, device reset or even irreparable physical damage through the fusing or rupture of device components. To avoid such disruptions, many devices contain some form of ESD suppression to protect internal components from a received discharge.

One method of ESD suppression involves adding components between the ESD introduction path and the ground plane. Common ESD suppression components include diodes, zener diodes, resistors and capacitors to route or direct any electrical surge away from the protected components. However, these components remain an active portion of the circuitry. As such, ESD suppression in this manner can impair performance of the protected circuitry or otherwise lead to signal loss.

Another method of ESD suppression is to place a spark gap between the ESD introduction path and a ground plane. The spark gap is typically designed for a threshold or breakdown voltage such that discharges exceeding this voltage arc across the gap and are conducted to ground. Such methods of ESD suppression have been incorporated onto printed circuit boards (PCBs). However, it is challenging to maintain tight tolerances in the separation between the introduction path and the ground plane. Designers may thus specify a separation that is larger than desired in order to avoid shorting the introduction path to the ground plane. Larger separations lead to higher breakdown voltages, which may limit the protection provided.

For the reasons stated above, and for other reasons stated below that will become apparent to those skilled in the art upon reading and understanding the present specification, there is a need in the art for alternative apparatus for suppression of ESD events.

SUMMARY

The various embodiments described herein facilitate protection of electronic devices. The various embodiments include one or more electrostatic discharge (ESD) elements. The ESD element includes a pair of spark gaps between a first side and second side of the ESD element. The first side of the ESD element includes a peaked portion and a substantially planar portion. The second side of the ESD element includes a peaked portion opposite the substantially planar portion of the first side and a substantially planar portion opposite the peaked portion of the first side. This asymmetry facilitates use of peaked emitters regardless of the polarity of the charge applied to the ESD element while further facilitating the use of more optimized receiver surfaces opposite the emitters. Embodiments of the invention include apparatus of varying scope.

DETAILED DESCRIPTION

In the following detailed description of the present embodiments, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that process, electrical or mechanical changes may be made without departing from the scope of the present invention. The following detailed description is, therefore, not to be taken in a limiting sense, and the scope of the present invention is defined only by the appended claims and equivalents thereof.

The various embodiments described herein facilitate protection of electronic devices. The various embodiments include one or more electrostatic discharge (ESD) elements, e.g., ESD element 300 of FIG. 3A. The ESD element includes a pair of spark gaps, e.g., spark gap 308 and spark gap 309 of FIG. 3A.

Figure 1A:
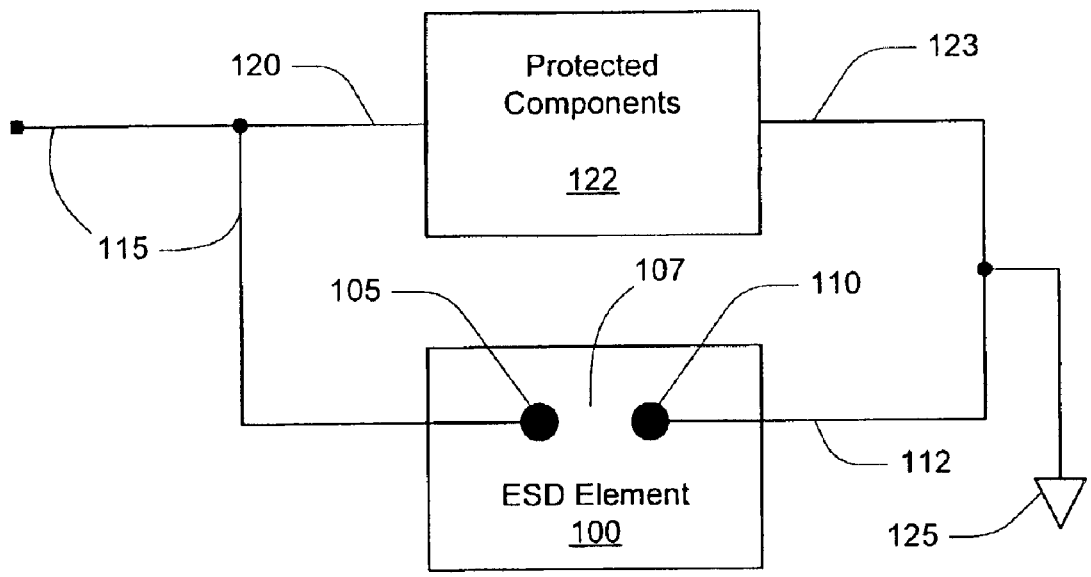
FIG. 1A is a block diagram showing the use of an ESD element in accordance with an embodiment of the invention.

FIG. 1A is a block diagram showing the use of an ESD element 100 in accordance with an embodiment of the invention. The ESD element 100 is coupled between a conductor 115 and a ground plane 125 to protect electronic components 122 of an electronic device. The conductor 115 represents the ESD introduction path and may be, e.g., a conductor for an externally-applied I/O (input/output) signal or power signal for the protected components 122. The conductor 115 is coupled to the protected components 122 through a conductor 120 while the protected components 122 are coupled to a ground plane 125 through a conductor 123. The ESD element 100 includes a first node 105 for coupling to the conductor 115 and a second node 110 for coupling to the ground plane 125 through a conductor 112. Although conductor 120 is depicted in FIG. 1A as being outside the ESD element 100, the coupling between conductors 115 and 120 may occur within the ESD element 100 including coupling at the first node 105. A spark gap pair 107 is defined by the separation of the first node 105 from the second node 110 as will be described in detail herein. Such gap pairs 107 are typically on the order of approximately 0.1 mm.

The ESD element 100 provides ESD suppression to the protected components 122 by providing an alternate discharge path for potentials applied to the conductor 115 that exceed the breakdown voltage of the ESD element 100. As will be described herein, potentials exceeding the breakdown voltage may be of either polarity. If a potential is applied to the conductor 115 that exceeds the breakdown voltage, arcing occurs between the nodes 105 and 110, creating a discharge path between the conductor 115 and the ground plane 125 through the ESD element 100. The static charge imbalance between the conductor 115 and the ground plane 125 will be equilibrated across the ESD element 100, removing the possibly damaging potential from the protected components 122.

Figure 1B:
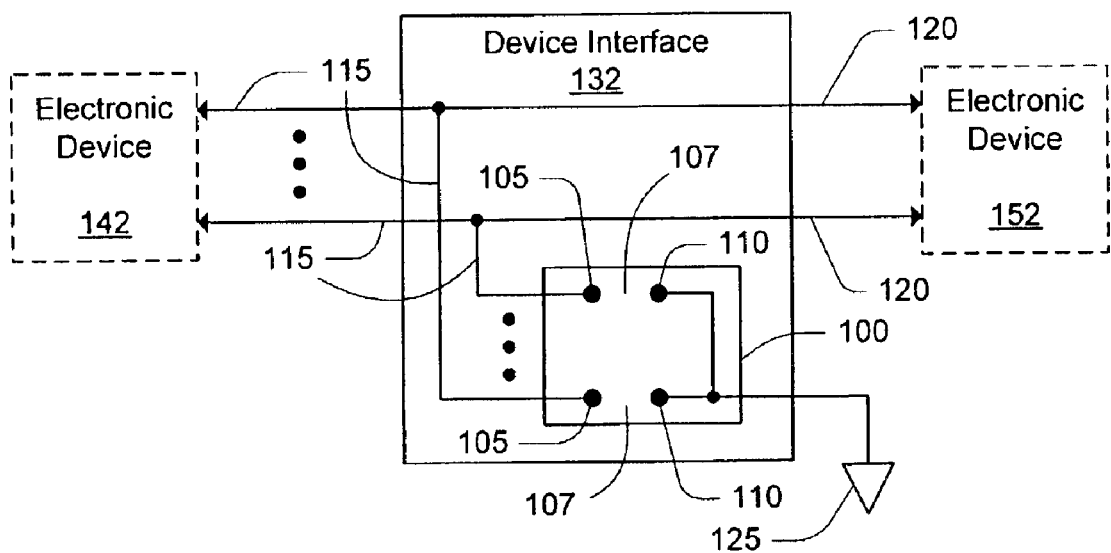
FIG. 1B is a schematic of a device interface in accordance with an embodiment of the invention for coupling between a first electronic device and a second electronic device.

For one embodiment, the ESD element 100 is part of an interface between electronic devices. For example, a handheld computer, digital camera, personal digital assistant (PDA) or other electronic device may utilize a docking station or cable to interface to a personal computer. FIG. 1B is a schematic of a device interface 132 for coupling between a first electronic device 142 and a second electronic device 152, with the desired signal from the first electronic device 142 to conductor 115 to conductor 120 to the second electronic device 152. The device interface 132 contains an ESD element 100 in accordance with an embodiment of the invention for coupling between the conductors 115 (or 120) and a ground plane 125. The conductors 115 and 120 are adapted for electrical communication between the devices 142 and 152. Such communication may include passing electrical signals between the two devices 142 and 152, such as control signals or data signals, or providing supply or ground potentials from one device to the other. For one embodiment, the ground plane 125 is part of the device interface 132 as shown in FIG. 1B. Alternatively, the ground plane 125 may be provided by either electronic device 142 or 152. For a further embodiment, the device interface 132 is a part of one of the electronic devices 142 or 152. For example, an electronic device 142 having a connector for coupling to another electronic device 152, either directly or through an intermediary cable or docking station, may include the ESD element 100 within the electronic device itself.

Figure 2:
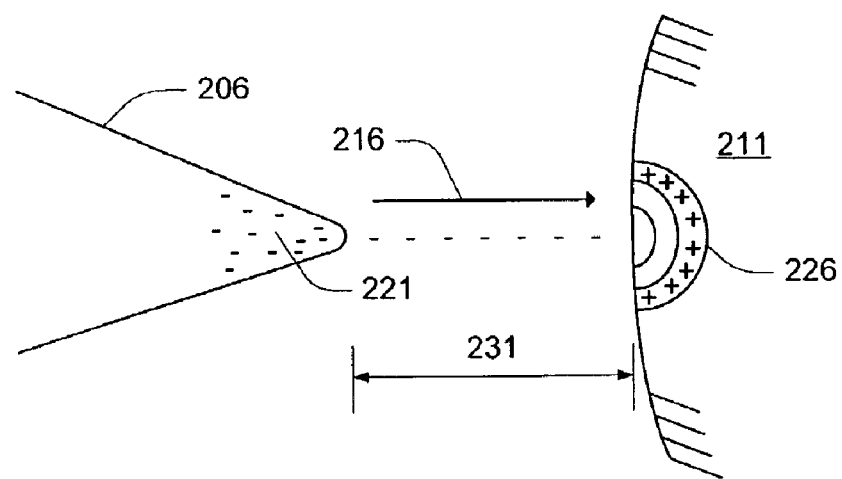
FIG. 2 is a schematic of a first node as an emitter having an applied charge and a second node as a spherical conducting receiver having an induced surface charge opposite the emitter.

As noted herein, a spark gap operates by providing an alternate discharge path for an electrostatic discharge. Because the spark gap is normally an open circuit, it has little detrimental affect on the protected circuitry. For the spark gap to become a closed circuit, electrical breakdown must occur between one node, an emitter, and the other node, a receiver. FIG. 2 is a schematic of a first node 206 as an emitter having an applied charge 221 (Q) and a second node 211 as a spherical conducting receiver having an induced surface charge 226 ($\sigma$) opposite the emitter 206. Pointed or peaked emitters are preferred for producing strong localized fields because the emitter itself shields its surface charges.

For breakdown to occur across the breakdown path 216, the electric field (E) at the emitter 206 must reach a critical value. The electric field includes contributions of the applied charge 221 and the induced charge 226. For a given applied charge 221 and separation 231, increasing diameters of the spherical receiver 211 generally lead to increasing values of induced surface charge 226. As the electric field at the emitter 206 includes contributions of both the applied charge 221 of the emitter 206 and the induced surface charge 226 of the receiver 211, it is preferable that the emitter 206 is peaked and the receiver 211 is substantially flat or planar. Such will facilitate lower breakdown voltages at a given separation 231. However, if the polarities of the applied charge 221 and the induced surface charge 226 were to be reversed, the geometries of the first node 206 and the second node 211 would be less desirable.

Figure 3A:
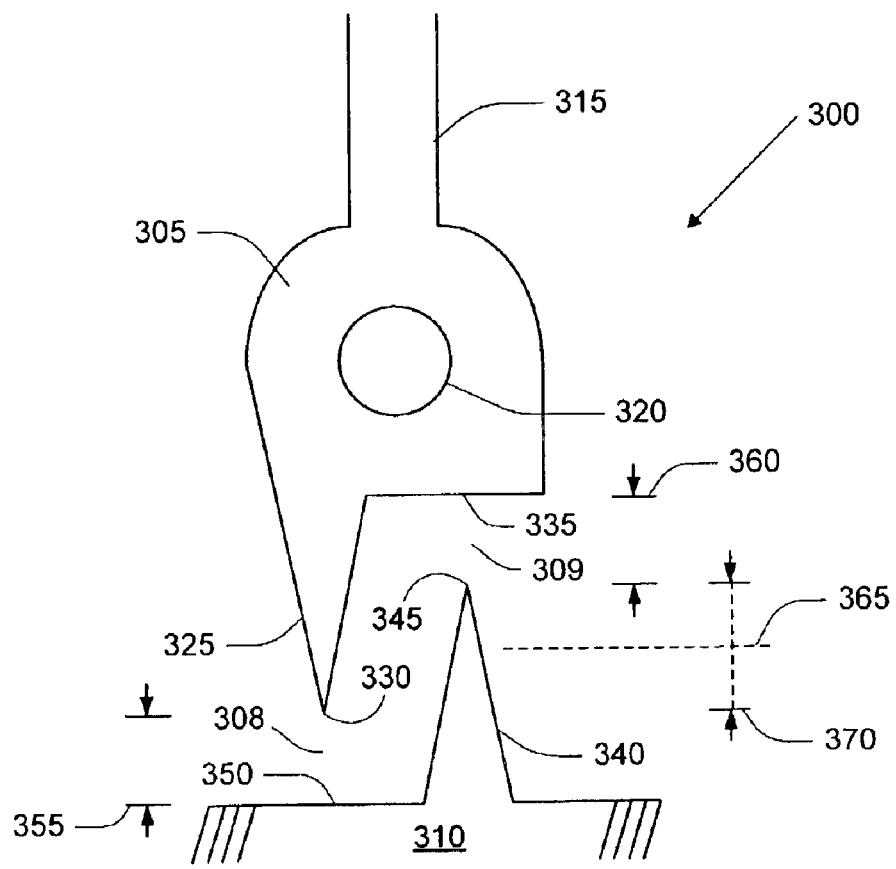
FIG. 3A is a planar view of an electrostatic discharge element in accordance with an embodiment of the invention.

FIG. 3A is a planar view of an ESD element 300 in accordance with an embodiment of the invention. For one embodiment, the ESD element 300 is formed on a printed circuit board (PCB), such as by standard copper plating techniques. The ESD element 300 includes a first node 305 having a conductor 315 for receiving applied signals, such as externally-applied control signals, data signals or power signals. For one embodiment, the conductor 315 is coupled to a pin, line or other conductor of a cable, port, jack or other connector for coupling to a mated electronic device. Such connectors may be industry-standard connectors, such as RS-232, RJ-45, universal serial bus (USB), etc. Alternatively, such connectors may be proprietary connectors having some non-standard arrangement of conductors.

The first node 305 may further include a conductor 320 for coupling to protected components 122 (not shown in FIG. 3A). As noted with reference to FIG. 1A, the conductor 320 need not be part of the first node 305, but may be coupled to conductor 315 at some prior point. However, placing the conductor 320 at or near the first node 305 is preferred as it tends to reduce the risk of exposing an excessive voltage to the protected components. For one embodiment, the conductor 320 is a via of the PCB, providing communication to a side of the PCB opposite the side containing the first node 305. However, the conductor 320 may be adapted to provide coupling of the first node 305 to protected components 122 from the same side of the PCB. Similarly, the conductor 315 may be coupled to the first node 305 through the via 320 from the underside of the PCB.

For one embodiment, the conductor 320 is coupled directly to protected components 122. For another embodiment, the conductor 320 is coupled to a pin, line or other conductor of a cable, port, jack or other connector for coupling to mated electronic devices, similar to the conductor 315. For embodiments where conductors 315 and 320 are each coupled to connectors, the connectors may be of the same type or of different types, dependent only upon the design requirements for coupling the ESD element between two desired electronic devices.

The first node 305 further includes a peaked portion 325 for a charge emitter and a substantially planar portion 335 for a charge receiver. The peaked portion 325 extends beyond the substantially planar portion 335 toward a substantially planar portion 350 of a second node 310. The substantially planar portion 350 can act as a charge receiver. The second node 310 further includes a peaked portion 340 for a charge emitter extending beyond the substantially planar portion 350 toward the substantially planar portion 335 of the first node 305.

The peaked portion 325 extends beyond a midline 365 of a distance 370 measured between the apex 330 of the peaked portion 325 and the apex 345 of the peaked portion 340. Each peaked portion terminates in an apex having a reversal of slopes from one side of the apex to the other, i.e., the apex defines a narrowed or pointed end of the peaked portion. The point of closest contact between the peaked portion 325 and the second node 310 occurs at the substantially planar portion 350 generally opposite the apex 330 and is represented by distance 355. The space between the substantially planar portion 350 and the apex 330 generally defines a spark gap 308 for a breakdown path from the first node 305 to the second node 310.

The point of closest contact between the peaked portion 340 and the first node 305 occurs at the substantially planar portion 335 generally opposite the apex 345 and is represented by distance 360. The space between the substantially planar portion 335 and the apex 345 defines a spark gap 309 for a breakdown path from the second node 310 to the first node 305.

For one embodiment, the distances 355 and 360 are equal such that the breakdown voltage will be the same regardless of the polarity of a charge applied to the conductor 315. For another embodiment, the distances 355 and 360 are different such that the breakdown voltage for one polarity will differ from the breakdown voltage of an opposite polarity. The distances 355 and 360 can be varied by the designer to define the breakdown voltage for the emitters 325 and 340, respectively, but are generally on the order of approximately 0.1 mm for typical ESD suppression requirements.

While the substantially planar portions 335 and 350 are preferably flat, i.e., relatively large radius of curvature, they need not be. However, the portion 325 of the first node 305 must extend closer to the portion 350 of the second node 310 than does the portion 335, while the portion 340 of the second node 310 must extend closer to the portion 335 of the first node 305 than does the portion 350. This asymmetry facilitates use of peaked emitters regardless of the polarity of the charge applied to the conductor 315 while further facilitating the use of more optimized receiver surfaces. Mobile charge carriers preferentially travel from a peaked portion 325 or 340 of one node to its associated substantially planar portion 350 or 335, respectively, on the opposing node.

The peaked portions of FIG. 3A may be generally described as triangular or angular convex shapes. While it is preferred that the apex of a peaked portion end in a point, such as the intersection of two lines, the realities of industrial fabrication techniques make such a preferred apex unlikely. Accordingly, the apex or other features of the peaked portions may have curved or rounded profiles.

Figure 3B:
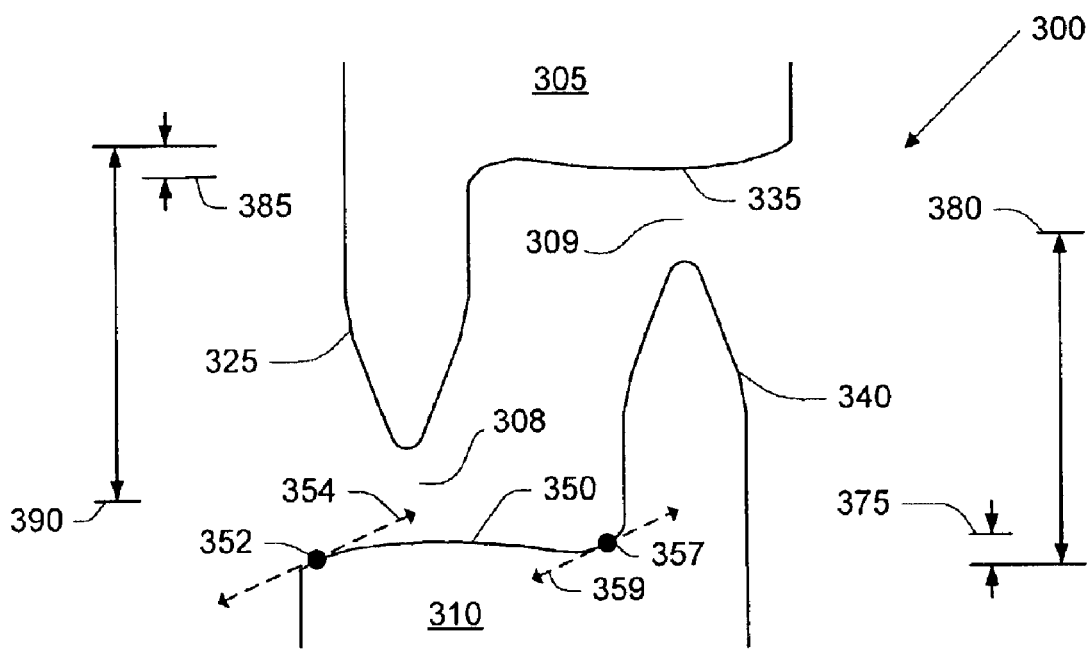
FIG. 3B is a planar view of a portion of an electrostatic discharge element in accordance with another embodiment of the invention.

FIG. 3B is a planar view of a portion of an ESD element 300 in accordance with another embodiment of the invention. As shown in FIG. 3B, the substantially planar portions 335 and 350 of the nodes 305 and 310, respectively, are not flat, but are convex profiles. Although not shown, the substantially planar portions 335 and 350 may be concave profiles or some complex profile containing flat, convex and/or concave components. The peaked portions 325 and 340 in FIG. 3B utilize a more complex angular convex profile than what is shown in FIG. 3A. Other profiles terminating in an apex may also be used.

The substantially planar portion 350 has a height 375 measured from its lowest point facing the opposing node 305 to its highest point facing the opposing node 305. The substantially planar portion 335 has a height 385 measured from its lowest point facing the opposing node 310 to its highest point facing the opposing node 310. The peaked portion 340 has a height 380 measured from the lowest point of its adjacent substantially planar portion 350 facing the opposing node 305 to the apex of the peaked portion 340. The peaked portion 325 has a height 390 measured from the lowest point of its adjacent substantially planar portion 335 facing the opposing node 310 to apex of the peaked portion 325.

A point on a substantially planar portion that is facing the opposing node is a point from which a tangent will extend between the apex of the peaked portion of the opposing node and substantially planar portion itself. For example, point 352 is a point of the substantially planar portion 350 facing the opposing node 305 as its tangent 354 passes between the substantially planar portion 350 and the apex of the peaked portion 325. However, point 357 is not a point of the substantially planar portion 350 facing the opposing node 305 as its tangent 359 does not pass between the substantially planar portion 350 and the apex of the peaked portion 325.

The heights 375 and 385 are preferably less than the distance of separation of their respective spark gaps 309 and 308 (see, e.g., distances 355 and 360 of FIG. 3A). For one embodiment, the heights 375 and 385 are each less than half of the distance of separation of their respective spark gaps 309 and 308. In addition, the heights 380 and 390 are preferably several times greater than the heights 375 and 385, respectively. For one embodiment, the heights 380 and 390 are at least five times the heights 375 and 385, respectively. For another embodiment, the heights 380 and 390 are approximately one order of magnitude, or more, greater than the heights 375 and 385, respectively.

Figure 4:
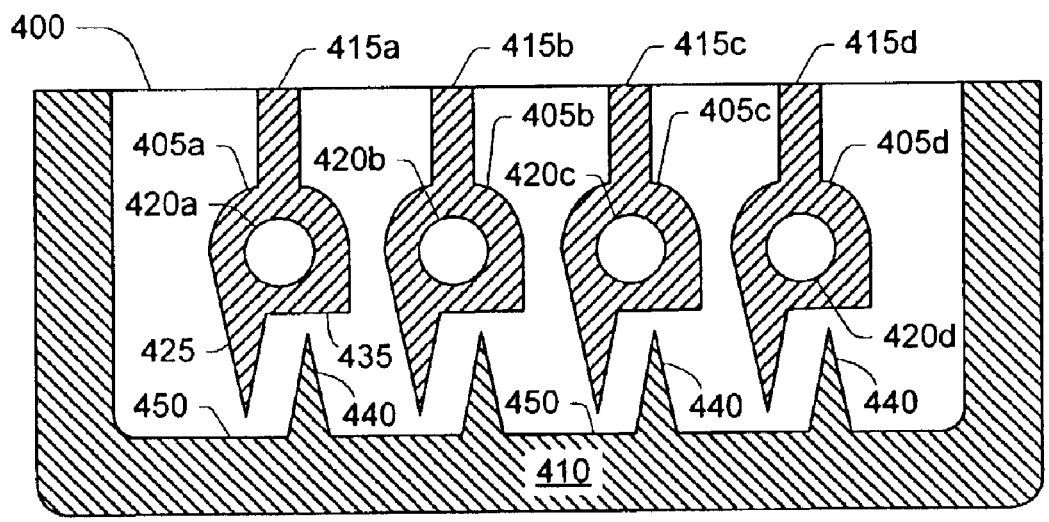
FIG. 4 is a planar view of a printed circuit board containing multiple electrostatic discharge elements sharing a single second node.

While the ESD element 300 may be used for a single conductor providing one signal path, it is common for electronic devices to utilize multiple conductors in their couplings for the parallel communication of multiple signals. FIG. 4 is a planar view of a PCB 400 containing multiple ESD elements with individual first nodes 405a–d for receiving multiple applied electrical signals across conductors 415a–d. The conductors 415a–d are coupled to conductors 420a–d for providing the desired signal path to the protected components (not shown in FIG. 4). For the embodiment depicted in FIG. 4, each conductor 420 is coupled to its respective conductor 415 at a first node 405. Each first node 405 has a peaked portion 425 and a substantially planar portion 435. The second node 410 is contiguous in FIG. 4 and shared with each first node 405. However, each first node 405 could alternatively be associated with a separate second node.

As depicted in FIG. 4, the second node 410 includes multiple peaked portions 440 and substantially planar portions 450. The peaked portions 440 of the second node 410 are opposite substantially planar portions 435 of the first nodes 405. The substantially planar portions 450 of the second node 410 are opposite peaked portions 425 of the first nodes 405. The second node 410 acts as the ground plane and its coupling to ground will vary depending upon its intended use. For example, if the PCB 400 is a portion of an electronic device, the second node 410 may be coupled to a ground node of the electronic device or an external ground node. If the PCB 400 is a portion of a device interface, the second node 410 may be coupled to a ground node within the device interface. Alternatively, the second node 410 may be coupled to a conductor of the device interface that is adapted for coupling to a ground node of one or more of the electronic devices to which the device interface is adapted to connect.

What is claimed is:

1. An electrostatic discharge element, comprising:
    a first side of the electrostatic discharge element comprising a peaked portion and an adjacent substantially planar portion;
    a second side of the electrostatic discharge element comprising a peaked portion opposite the substantially planar portion of the first side and a substantially planar portion opposite the peaked portion of the first side, wherein the substantially planar portion of the second side is adjacent the peaked portion of the second side;
    a first spark gap between the peaked portion of the first side and the substantially planar portion of the second side; and
    a second spark gap between the peaked portion of the second side and the substantially planar portion of the first side;

wherein a point of closest contact between the first side and the peaked portion of the second side occurs at the substantially planar portion of the first side generally opposite an apex of the peaked portion of the second side; and wherein a point of closest contact between the second side and the peaked portion of the first side occurs at the substantially planar portion of the second side generally opposite an apex of the peaked portion of the first side.

2. The electrostatic discharge element of claim 1, wherein a separation between the substantially planar portion of the first side and the peaked portion of the second side at their point of closest contact is approximately equal to a separation between the substantially planar portion of the second side and the peaked portion of the first side at their point of closest contact.

3. The electrostatic discharge element of claim 1, wherein each substantially planar portion is approximately flat.

4. The electrostatic discharge element of claim 1, wherein a height of a substantially planar portion is less than a separation distance of its associated spark gap.

5. The electrostatic discharge element of claim 4, wherein a height of each peaked portion is at least five times a height of its adjacent substantially planar portion.

6. An electrostatic discharge element, comprising:
a first node comprising a substantially angular convex portion adjacent a substantially planar portion; and
a second node comprising a substantially angular convex portion adjacent a substantially planar portion;
wherein the substantially angular convex portion of the first node is opposite the substantially planar portion of the second node and has a point of closest contact to the second node at the substantially planar portion of the second node generally opposite an apex of the substantially angular convex portion of the first node; and
wherein the substantially angular convex portion of the second node is opposite the substantially planar portion of the first node and has a point of closest contact to the first node at the substantially planar portion of the first node generally opposite an apex of the substantially angular convex portion of the second node.

7. The electrostatic discharge element of claim 6, wherein features of the substantially angular convex portions are rounded.

8. The electrostatic discharge element of claim 6, wherein the apex of the substantially angular convex portion of the first node extends beyond the substantially planar portion of the first node toward the second node and beyond a midline, wherein apex of the substantially angular convex portion of the second node extends beyond the substantially planar portion of the second node toward the first node and beyond the midline, and wherein the midline is measured between the apex of the substantially angular convex portion of the first node and the apex of the substantially angular convex portion of the second node.

9. An electrostatic discharge element, comprising:
a first node having a first portion extending beyond a second portion; and
a second node opposing the first node and having a first portion extending beyond a second portion;
wherein a closest point of the first portion of the first node to any point on the second node occurs at the second portion of the second node generally opposite an apex of the first portion of the first node; and
wherein a closest point of the first portion of the second node to any point on the first node occurs at the second portion of the first node generally opposite an apex of the first portion of the second node.

10. The electrostatic discharge element of claim 9, wherein each first portion is peaked and each second portion is substantially flat.

11. The electrostatic discharge element of claim 10, wherein each first portion has a rounded apex.

12. The electrostatic discharge element of claim 9, wherein a height of a second portion is less than half of a separation at the closest point between that second portion and the first portion of the opposing node.

13. The electrostatic discharge element of claim 12, wherein a height of a first portion is at least one order of magnitude greater than the height of its associated second portion.

14. A printed circuit board, comprising:
a signal input for coupling one or more applied signals to internal circuitry of the printed circuit board;
a ground plane for coupling to a ground potential; and
an electrostatic discharge element, wherein the electrostatic discharge element comprises:
a first side coupled to the signal input and comprising a peaked portion and an adjacent substantially planar portion;
a second side coupled to the ground plane and comprising a peaked portion opposite the substantially planar portion of the first side and a substantially planar portion opposite the peaked portion of the first side, wherein the substantially planar portion of the second side is adjacent the peaked portion of the second side;
a first spark gap between the peaked portion of the first side and the substantially planar portion of the second side; and
a second spark gap between the peaked portion of the second side and the substantially planar portion of the first side;
wherein a point of closest contact between the first side and the peaked portion of the second side occurs at the substantially planar portion of the first side generally opposite an apex of the peaked portion of the second side; and
wherein a point of closest contact between the second side and the peaked portion of the first side occurs at the substantially planar portion of the second side generally opposite an apex of the peaked portion of the first side.

15. A printed circuit board, comprising:
a signal input for coupling one or more applied signals to internal circuitry of the printed circuit board;
a ground plane for coupling to a ground potential; and
an electrostatic discharge element, wherein the electrostatic discharge element comprises:
a first side coupled to the signal input and comprising a peaked portion and a substantially planar portion;
a second side coupled to the ground plane and comprising a peaked portion opposite the substantially planar portion of the first side and a substantially planar portion opposite the peaked portion of the first side;
a first spark gap between the peaked portion of the first side and the substantially planar portion of the second side; and
a second spark gap between the peaked portion of the second side and the substantially planar portion of the first side;

wherein the printed circuit board further comprises multiple signal inputs and an electrostatic discharge element coupled to each signal input, and wherein each electrostatic discharge element has a separate first side and shares a contiguous second side.

16. The printed circuit board of claim 14, wherein a distance of separation between the substantially planar portion of the first side and the peaked portion of the second side at their point of closest contact and a distance of separation between the substantially planar portion of the second side and the peaked portion of the first side at their point of closest contact are adjusted to provide a different breakdown voltage for potentials of a first polarity applied at the first side than for potentials of an opposite polarity applied at the first side.

17. The printed circuit board of claim 14, wherein each substantially planar portion is approximately flat.

18. The printed circuit board of claim 14, wherein a height of a substantially planar portion is less than approximately half of a distance of separation at its associated spark gap.

19. The electrostatic discharge element of claim 18, wherein a height of each peaked portion is at least five times a height of its adjacent substantially planar portion.

20. A printed circuit board, comprising:
a plurality of signal inputs for coupling applied signals to internal circuitry of the printed circuit board;
a ground plane for coupling to a ground potential; and
a plurality of electrostatic discharge elements, wherein each electrostatic discharge element comprises:
a first node coupled to one of the signal inputs and comprising a substantially angular convex portion adjacent a substantially planar portion;
a second node coupled to the ground plane and comprising a substantially angular convex portion adjacent a substantially planar portion;
wherein the substantially angular convex portion of the first node is opposite the substantially planar portion of the second node and has a point of closest contact to the second node at the substantially planar portion of the second node generally opposite an apex of the substantially angular convex portion of the first node; and
wherein the substantially angular convex portion of the second node is opposite the substantially planar portion of the first node and has a point of closest contact to the first node at the substantially planar portion of the first node generally opposite an apex of the substantially angular convex portion of the second node.

21. The printed circuit board of claim 20, wherein each second node is contiguous with the second nodes of other electrostatic discharge elements.

22. The printed circuit board of claim 20, wherein the apex of the substantially angular convex portion of the first node extends beyond the substantially planar portion of the first node toward the second node and beyond a midline, wherein the apex of the substantially angular convex portion of the second node extends beyond the substantially planar portion of the second node toward the first node and beyond the midline, and wherein the midline is measured between the apex of the substantially angular convex portion of the first node and the apex of the substantially angular convex portion of the second node.

23. A device interface, comprising:
at least one conductor for coupling between a first electronic device and a second electronic device; and
an electrostatic discharge element for each at least one conductor, each electrostatic discharge element comprising a first node coupled to its associated conductor and a second node for coupling to a ground potential;
wherein the first node comprises a peaked portion and an adjacent substantially planar portion;
wherein the second node comprises a peaked portion opposite the substantially planar portion of the first node and an adjacent substantially planar portion opposite the peaked portion of the first node;
wherein a first spark gap is defined between the peaked portion of the first node and the substantially planar portion of the second node, having a point of closest contact occurring at the substantially planar portion of the second node generally opposite an apex of the peaked portion of the first node; and
wherein a second spark gap is defined between the peaked portion of the second node and the substantially planar portion of the first node having a point of closest contact occurring at the substantially planar portion of the first node generally opposite an apex of the peaked portion of the second node.

24. The device interface of claim 23, wherein each second node is coupled to a ground plane for coupling to an external ground potential.

25. A device interface, comprising:
at least one conductor for coupling between a first electronic device and a second electronic device; and
an electrostatic discharge element for each at least one conductor, each electrostatic discharge element comprising a first node coupled to its associated conductor and a second node for coupling to a ground potential;
wherein the electrostatic discharge element first node comprises a substantially angular convex portion adjacent a substantially planar portion;
wherein the electrostatic discharge element second node comprises a substantially angular convex portion adjacent a substantially planar portion;
wherein the substantially angular convex portion of the first node is opposite the substantially planar portion of the second node and the substantially angular convex portion of the second node is opposite the substantially planar portion of the first node;
wherein a point of closest contact between the first node and the substantially annular convex portion of the second node occurs at the substantially planar portion of the first node generally opposite an apex of the substantially angular convex portion of the second node; and
wherein a point of closest contact between the second node and the substantially angular convex portion of the first node occurs at the substantially planar portion of the second node generally opposite an apex of the substantially angular convex portion of the first node.

26. An electrostatic discharge element, comprising:
a first asymmetrical discharge means for coupling between an electrostatic discharge introduction path and a ground plane, having a first portion for preferentially acting as a charge emitter for a voltage received at the electrostatic discharge introduction path that exceeds a first threshold voltage and has a first polarity and having an adjacent second portion for preferentially acting as a charge receiver for a voltage received at the electrostatic discharge introduction path that exceeds a second threshold voltage and has a second polarity opposite the first polarity; and
a second asymmetrical discharge means for coupling between the electrostatic discharge introduction path and the ground plane, having a first portion for preferentially acting as a charge emitter for a voltage received at the electrostatic discharge introduction path that exceeds the second threshold voltage and has the second polarity and having an adjacent second portion for preferentially acting as a charge receiver for a voltage received at the electrostatic discharge introduction path that exceeds the first threshold voltage and has the first polarity;

wherein the first portion of the first asymmetrical discharge means is opposite the second portion of the second asymmetrical discharge means; and wherein the second portion of the first asymmetrical discharge means is opposite the first portion of the second asymmetrical discharge means.

27. The electrostatic discharge element of claim 26, wherein the first threshold voltage and the second threshold voltage are approximately equal in magnitude.

28. The electrostatic discharge element of claim 26, wherein the second discharge means is contiguous with at least one additional second discharge means.

29. A method of protecting an electronic component from an electrostatic discharge event, comprising:

receiving the electrostatic discharge event at a first node of an electrostatic discharge element, wherein the first node has a charge emitter portion and an adjacent charge receiver portion and wherein the electrostatic discharge event produces a charge imbalance between the first node of the electrostatic discharge element and a second node of the electrostatic discharge element;

equilibrating the charge imbalance by transferring excess charge from the charge emitter portion of the first node to a charge receiver portion of the second node when the electrostatic discharge event has a first polarity; and equilibrating the charge imbalance by transferring excess charge from a charge emitter portion of the second node to the charge receiver portion of the first node when the electrostatic discharge event has a second polarity opposite the first polarity;

wherein the charge receiver portion of the second node is adjacent the charge emitter portion of the second node;

wherein the charge emitter portions of the first and second nodes are peaked portions of the first and second nodes, respectively;

wherein the charge receiver portions of the first and second nodes are substantially planar portions of the first and second nodes, respectively;

wherein a point of closest contact between the first node and the charge emitter portion of the second node occurs at the charge receiver portion of the first node generally opposite an apex of the charge emitter portion of the second node; and wherein a point of closest contact between the second node and the charge emitter portion of the first node occurs at the charge receiver portion of the second node generally opposite an apex of the charge emitter portion of the first node.

30. The method of claim 29, a distance of separation between the substantially planar portion of the first node and the peaked portion of the second node is approximately equal to a distance of separation between the substantially planar portion of the second node and the peaked portion of the first node.

* * * * *

UNITED STATES PATENT AND TRADEMARK OFFICE
CERTIFICATE OF CORRECTION

PATENT NO. : 6,859,351 B2
APPLICATION NO. : 10/215501
DATED : February 22, 2005
INVENTOR(S) : Daniel J. Byrne et al.

It is certified that error appears in the above-identified patent and that said Letters Patent is hereby corrected as shown below:

Column 7, Line 50, after "wherein" insert --the--

Column 10, Line 44, delete "annular" and insert therefor --angular--

Signed and Sealed this

Twentieth Day of May, 2008

JON W. DUDAS
*Director of the United States Patent and Trademark Office*